United States Patent
Mori et al.

(10) Patent No.: US 11,577,512 B2
(45) Date of Patent: Feb. 14, 2023

(54) LIQUID DISCHARGE HEAD, LIQUID DISCHARGE APPARATUS, AND ACTUATOR

(71) Applicant: SEIKO EPSON CORPORATION, Tokyo (JP)

(72) Inventors: Masaki Mori, Shiojiri (JP); Motoki Takabe, Shiojiri (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 17/149,382

(22) Filed: Jan. 14, 2021

(65) Prior Publication Data
US 2021/0221136 A1    Jul. 22, 2021

(30) Foreign Application Priority Data
Jan. 17, 2020  (JP) ............................ JP2020-005728

(51) Int. Cl.
| | | |
|---|---|---|
| *B41J 2/14* | (2006.01) | |
| *H01L 41/04* | (2006.01) | |
| *H01L 41/047* | (2006.01) | |
| *H01L 41/09* | (2006.01) | |
| *H01L 41/187* | (2006.01) | |

(52) U.S. Cl.
CPC ........ *B41J 2/14274* (2013.01); *H01L 41/042* (2013.01); *H01L 41/0475* (2013.01); *H01L 41/0477* (2013.01); *H01L 41/0973* (2013.01); *H01L 41/1876* (2013.01); *B41J 2002/14491* (2013.01)

(58) Field of Classification Search
None
See application file for complete search history.

(56) References Cited

U.S. PATENT DOCUMENTS

| | | | |
|---|---|---|---|
| 2009/0284568 A1 | 11/2009 | Yazaki | |
| 2012/0212546 A1* | 8/2012 | Yokoyama | H01L 41/0973 310/365 |
| 2014/0253641 A1* | 9/2014 | Furuya | B41J 2/161 310/365 |
| 2014/0267510 A1* | 9/2014 | Furuya | B41J 2/1631 310/317 |
| 2016/0093794 A1 | 3/2016 | Kakamu | |

FOREIGN PATENT DOCUMENTS

| | | |
|---|---|---|
| JP | 2009-172878 A | 8/2009 |
| JP | 2010-208137 A | 9/2010 |
| JP | 2016-072299 A | 5/2016 |

* cited by examiner

*Primary Examiner* — Erica S Lin
(74) *Attorney, Agent, or Firm* — Workman Nydegger

(57) ABSTRACT

A liquid discharge head to discharge a liquid includes a piezoelectric body, a first electrode layer disposed at least partly on the piezoelectric body in a stacking direction, and a first wiring disposed on the first electrode layer in the stacking direction, the first wiring being more likely to cause ion migration than the first electrode layer, in which the piezoelectric body, the first electrode layer, and the first wiring are stacked in the stacking direction. When a predetermined area on the piezoelectric body is a first area, and a predetermined area adjacent to the first area on the piezoelectric body is a second area, both the first wiring and the first electrode layer are disposed in the first area, and the first wiring is not disposed while the first electrode layer is disposed in the second area.

18 Claims, 11 Drawing Sheets

LIQUID DISCHARGE HEAD, LIQUID DISCHARGE APPARATUS, AND ACTUATOR

The present application is based on, and claims priority from JP Application Serial Number 2020-005728, filed Jan. 17, 2020, the disclosure of which is hereby incorporated by reference herein in its entirety.

BACKGROUND

1. Technical Field

The present disclosure relates to a liquid discharge head, a liquid discharge apparatus, and an actuator.

2. Related Art

Techniques that use piezoelectric elements to discharge a liquid from a pressure chamber through nozzles have been proposed. The piezoelectric element described in JP-A-2009-172878 includes a piezoelectric body, an upper electrode disposed on the piezoelectric body, and a lower electrode disposed on the bottom of the piezoelectric body. An end of a lead electrode that is electrically connected to the lower electrode may be disposed on the piezoelectric body.

In the structure in which the lead electrode and the upper electrode are disposed on the piezoelectric body, however, when, for example, a voltage is applied to the lead electrode, a metal contained in the lead electrode may be ionized and move toward the upper electrode, that is, ion migration may occur.

SUMMARY

A liquid discharge head to discharge a liquid includes a piezoelectric body, a first electrode layer disposed at least partly on the piezoelectric body in a stacking direction, and a first wiring disposed on the first electrode layer in the stacking direction, the first wiring being more likely to cause ion migration than the first electrode layer, in which the piezoelectric body, the first electrode layer, and the first wiring are stacked in the stacking direction. When a predetermined area on the piezoelectric body is a first area, and a predetermined area adjacent to the first area on the piezoelectric body is a second area, both the first wiring and the first electrode layer are disposed in the first area, and the first electrode layer is disposed while the first wiring is not disposed in the second area.

A liquid discharge head to discharge a liquid includes a piezoelectric body, a first electrode layer disposed at least partly on the piezoelectric body in a stacking direction, and a first wiring disposed on the first electrode layer in the stacking direction, the first wiring having lower ionization energy than the first electrode layer, in which the piezoelectric body, the first electrode layer, and the first wiring are stacked in the stacking direction. When a predetermined area on the piezoelectric body is a first area, and a predetermined area adjacent to the first area on the piezoelectric body is a second area, both the first wiring and the first electrode layer are disposed in the first area, and the first wiring is not disposed while the first electrode layer is disposed in the second area.

A liquid discharge head to discharge a liquid includes a piezoelectric body, a first electrode layer disposed at least partly on the piezoelectric body in a stacking direction, the first electrode layer containing iridium (Ir), and a first wiring disposed on the first electrode layer in the stacking direction, the first wiring containing nichrome (NiCr), in which the piezoelectric body, the first electrode layer, and the first wiring are stacked in the stacking direction. When a predetermined area on the piezoelectric body is a first area, and a predetermined area adjacent to the first area on the piezoelectric body is a second area, both the first wiring and the first electrode layer are disposed in the first area, and the first wiring is not disposed while the first electrode layer is disposed in the second area.

A liquid discharge apparatus includes the liquid discharge head.

An actuator includes a piezoelectric body, a first electrode layer disposed at least partly on the piezoelectric body in a stacking direction, and a first wiring disposed on the first electrode layer in the stacking direction, the first wiring being more likely to cause ion migration than the first electrode layer, in which the piezoelectric body, the first electrode layer, and the first wiring are stacked in the stacking direction. When a predetermined area on the piezoelectric body is a first area, and a predetermined area adjacent to the first area on the piezoelectric body is a second area, both the first wiring and the first electrode layer are disposed in the first area, and the first wiring is not disposed while the first electrode layer is disposed in the second area.

An actuator includes a piezoelectric body, a first electrode layer disposed at least partly on the piezoelectric body in a stacking direction, and a first wiring disposed on the first electrode layer in the stacking direction, the first wiring having lower ionization energy than the first electrode layer, in which the piezoelectric body, the first electrode layer, and the first wiring are stacked in the stacking direction. When a predetermined area on the piezoelectric body is a first area, and a predetermined area adjacent to the first area on the piezoelectric body is a second area, both the first wiring and the first electrode layer are disposed in the first area, and the first wiring is not disposed while the first electrode layer is disposed in the second area.

An actuator includes a piezoelectric body, a first electrode layer disposed at least partly on the piezoelectric body in a stacking direction, the first electrode layer containing iridium (Ir), and a first wiring disposed on the first electrode layer in the stacking direction, the first wiring containing nichrome (NiCr), in which the piezoelectric body, the first electrode layer, and the first wiring are stacked in the stacking direction. When a predetermined area on the piezoelectric body is a first area, and a predetermined area adjacent to the first area on the piezoelectric body is a second area, both the first wiring and the first electrode layer are disposed in the first area, and the first wiring is not disposed while the first electrode layer is disposed in the second area.

DESCRIPTION OF EXEMPLARY EMBODIMENTS

1. First Embodiment 1-1. Overall Structure of Liquid Discharge Apparatus

Figure 1:
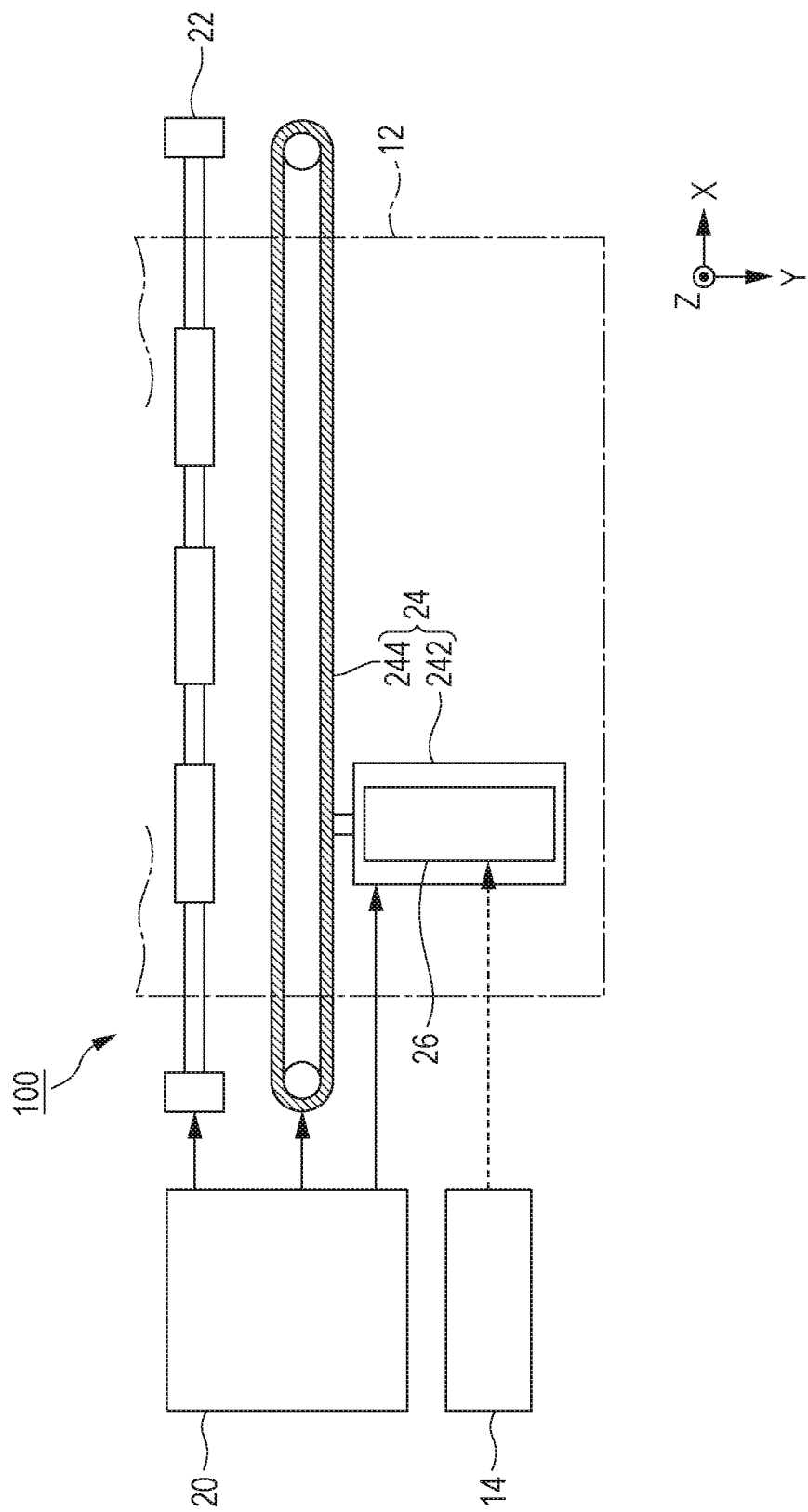
FIG. 1 is a block diagram illustrating a structure of a liquid discharge apparatus according to a first embodiment.

FIG. 1 illustrates a structure of a liquid discharge apparatus 100 according to a first embodiment. In the description below, for the sake of convenience, the X-axis, Y-axis, and Z-axis will be used as appropriate. The X-axis, the Y-axis, and the Z-axis are orthogonal to each other. On the X-axis, the direction indicated by the arrow is referred to as a +X direction, and the opposite direction is referred to as a −X direction. The same applies to the Y-axis and the Z-axis. The +Z direction denotes an upper direction, and the −Z direction denotes a lower direction. In this specification, the expression "an element B is disposed on an element A" is not limited to denoting a structure in which the element A and the element B are in direct contact. A structure in which the element A and the element B are not in direct contact is included in the concept denoted by "an element B is disposed on an element A".

The liquid discharge apparatus 100 according to the first embodiment is an ink jet printing apparatus that discharges an ink, which is an example liquid, onto a medium 12. The medium 12 is typically printing paper; alternatively, the medium 12 may be a print target of any material such as plastic film or cloth. As illustrated in FIG. 1, the liquid discharge apparatus 100 includes a liquid container 14 for storing ink. The liquid container 14 may be a cartridge that is detachably attached to the liquid discharge apparatus 100, a pouch-shaped ink pack made of a flexible film, or an ink tank that can be refilled with an ink.

As illustrated in FIG. 1, the liquid discharge apparatus 100 includes a control unit 20, a transport mechanism 22, a moving mechanism 24, and a liquid discharge head 26. The control unit 20 includes, for example, at least one processing circuit such as a central processing unit (CPU) or a field-programmable gate array (FPGA) and at least one storage circuit such as a semiconductor memory. The control unit 20 performs overall control of components in the liquid discharge apparatus 100. The transport mechanism 22 transports a medium 12 in the +Y direction under control of the control unit 20.

The moving mechanism 24 reciprocates the liquid discharge head 26 along the X-axis under the control of the control unit 20. The X-axis intersects the Y-axis along which a medium 12 is transported. The moving mechanism 24 includes a substantially box-shaped transport member 242 that accommodates the liquid discharge head 26, and a transport belt 244 to which the transport member 242 is fixed. It should be noted that a plurality of liquid discharge heads 26 may be mounted on the transport member 242, or the liquid container 14 may be mounted on the transport member 242 together with the liquid discharge head 26.

The liquid discharge head 26 discharges an ink supplied from the liquid container 14 through a plurality of nozzles onto a medium 12 under the control of the control unit 20. The liquid discharge head 26 discharges an ink onto the medium 12 simultaneously with the transport of the medium 12 by the transport mechanism 22 and with the reciprocation of the transport member 242, thereby forming an image on the medium 12.

1-2. Overall Structure of Liquid Discharge Head

Figure 2:
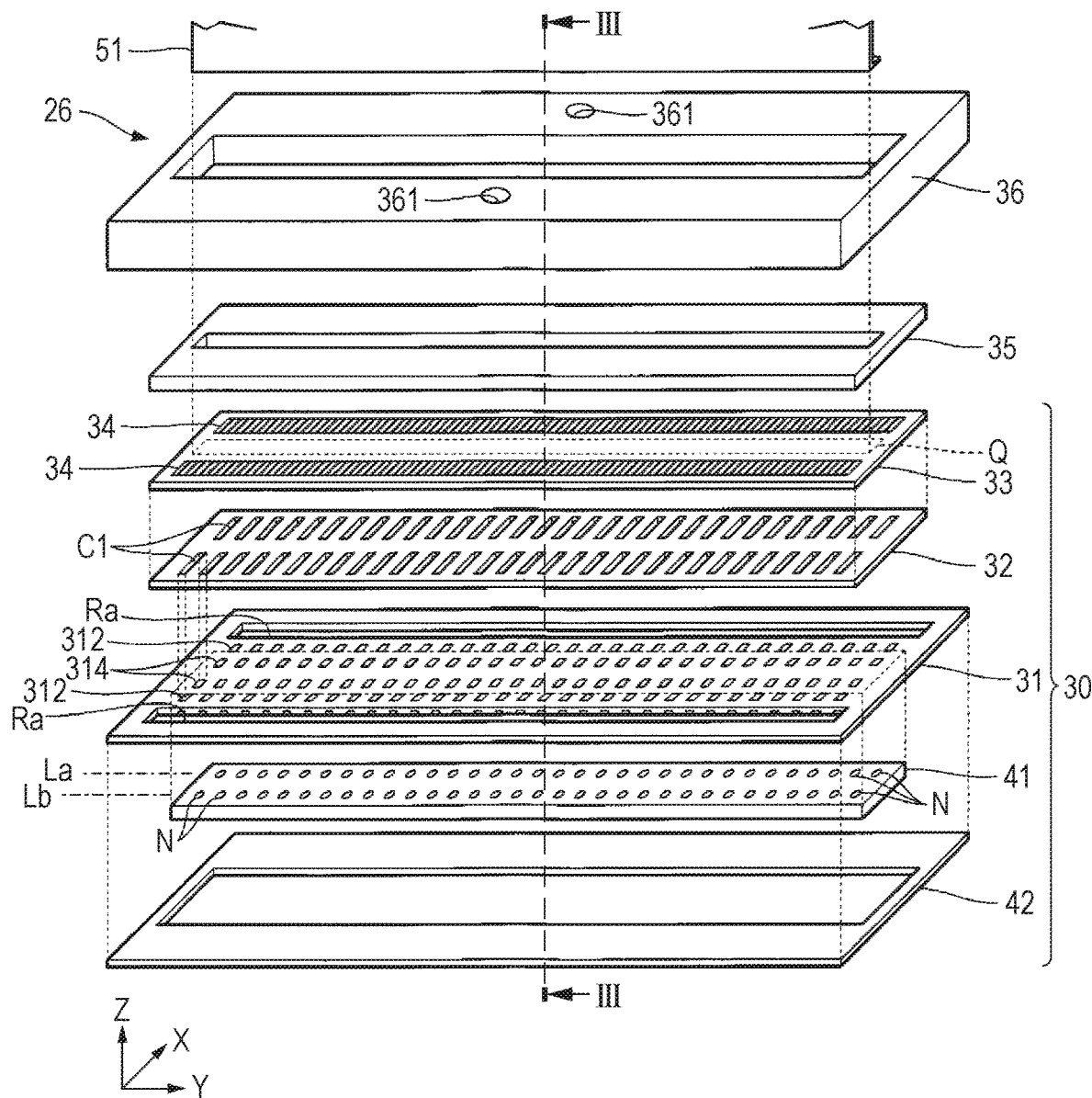
FIG. 2 is an exploded perspective view illustrating a liquid discharge head.
Figure 3:
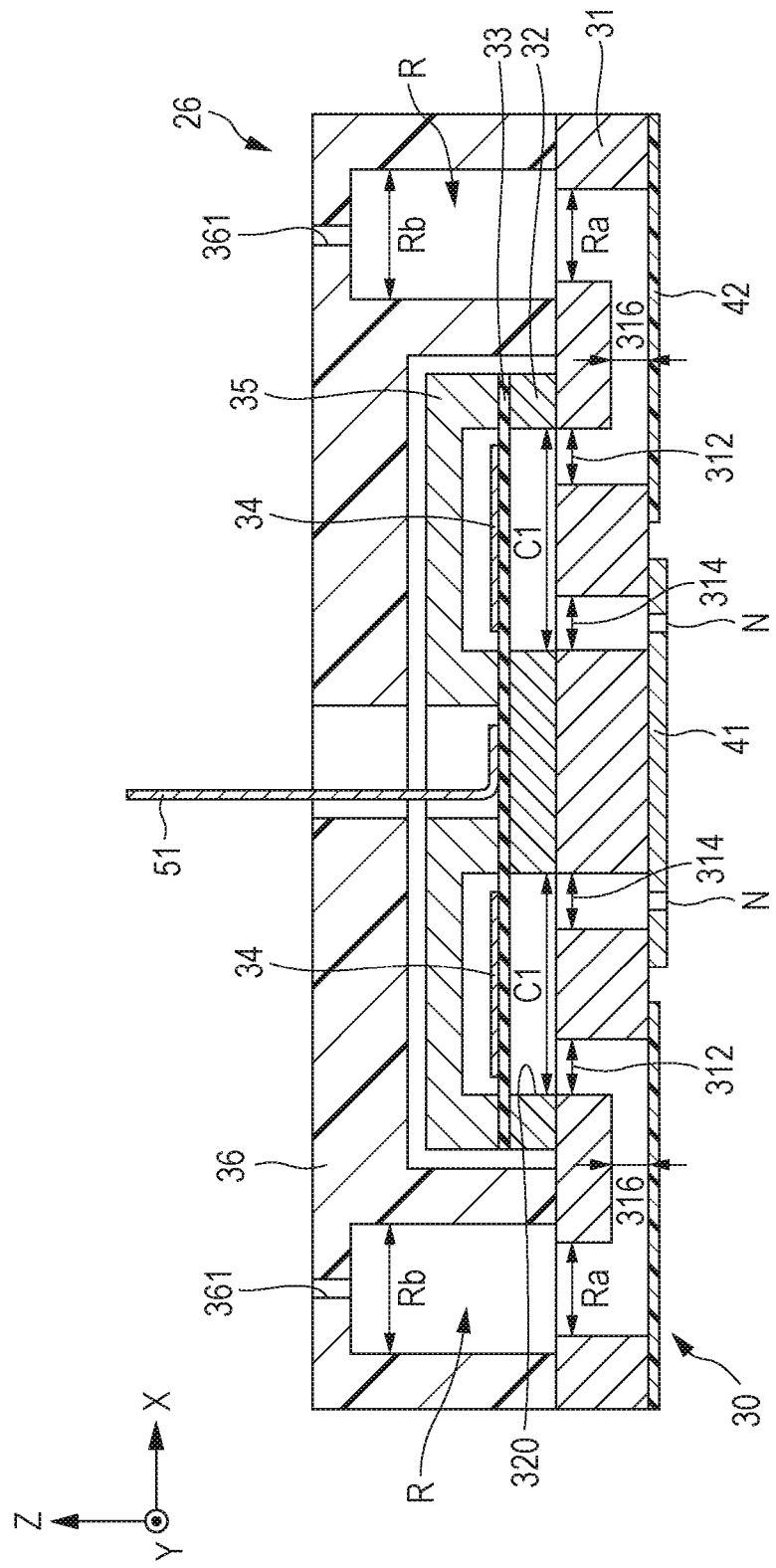
FIG. 3 is a cross-sectional view illustrating a liquid discharge head.

FIG. 2 is an exploded perspective view illustrating the liquid discharge head 26. FIG. 3 is a cross-sectional view taken along line III-III in FIG. 2. The cross section illustrated in FIG. 3 is parallel to the X-Z plane. The Z-axis is an axis in a direction in which the liquid discharge head 26 discharges an ink.

As illustrated in FIG. 2, the liquid discharge head 26 has a plurality of nozzles N that are arranged along the Y-axis. The nozzles N are divided into a first wiring La and a second wiring Lb that are arranged side by side at an interval along the X-axis. Each of the first wiring La and the second wiring Lb is a group of the nozzles N aligned along the Y-axis. As will be understood from FIG. 3, the liquid discharge head 26 has elements corresponding to each nozzle N in the first wiring La and elements corresponding to each nozzle N in the second wiring Lb arranged substantially symmetrically in a plane. Accordingly, the following descriptions focus on the elements corresponding to the first wiring La, and descriptions of the elements corresponding to the second wiring Lb may be omitted as appropriate.

As illustrated in FIG. 2 and FIG. 3, the liquid discharge head 26 includes a flow channel structure 30, a plurality of piezoelectric elements 34, a sealing member 35, a housing 36, and a wiring board 51. The piezoelectric element 34 is an example actuator. The flow channel structure 30 is a structure that has inner flow channels for supplying an ink to each of the nozzles N. The flow channel structure 30 includes a flow channel plate 31, a pressure chamber plate 32, a vibrating plate 33, a nozzle plate 41, and a vibration absorber 42. Each component of the flow channel structure 30 is an elongated plate-like member disposed along the Y-axis. The pressure chamber plate 32 and the housing 36 are disposed on a +Z-axis side of the flow channel plate 31. The nozzle plate 41 and the vibration absorber 42 are disposed on a −Z-axis side of the flow channel plate 31. Each component is fixed, for example, with an adhesive.

The nozzle plate 41 is a plate-like member that has the nozzles N. Each nozzle N is a circular through hole for discharging an ink. The nozzle plate 41 is manufactured, for example, by processing a single crystal substrate of silicon (Si) with semiconductor manufacturing techniques such as photolithography and photoetching. It should be noted that any known material and manufacturing method may be employed for manufacturing the nozzle plate 41.

The flow channel plate 31 has a space Ra, a plurality of supply flow channels 312, a plurality of communication flow channels 314, and a relay liquid chamber 316. The space Ra is an elongated opening along the Y-axis. Each of the supply flow channels 312 and the communication flow channels 314 is a through hole that is provided for each nozzle N. The relay liquid chamber 316 is an elongated space that extends along the Y-axis of the nozzles N to communicate with the space Ra and the supply flow channels 312. Each of the communication flow channels 314 overlaps one nozzle N that corresponds to the communication flow channel 314 in plan view from the +Z direction.

The pressure chamber plate 32 has a plurality of pressure chambers C1. The pressure chamber C1 is a space between the nozzle plate 41 and the vibrating plate 33 and is defined by a wall surface 320 of the pressure chamber plate 32. The pressure chamber C1 is provided for each nozzle N, and an ink is supplied from the liquid container 14 to the pressure chamber C1. The pressure chamber C1 is an elongated space along the X-axis in plan view. A plurality of pressure chambers C1 are arranged along the Y-axis. The flow channel plate 31 and the pressure chamber plate 32 are manufactured, similarly to the above-described nozzle plate 41, by processing a silicon single crystal substrate with semiconductor manufacturing techniques. It should be noted that any known material and manufacturing method may be employed for manufacturing the flow channel plate 31 and the pressure chamber plate 32.

As illustrated in FIG. 3, the elastically deformable vibrating plate 33 is disposed on the pressure chamber C1. The vibrating plate 33 is in contact with a surface of the pressure chamber plate 32 opposite to the flow channel plate 31. The vibrating plate 33 is an elongated rectangular plate-like member along the Y-axis in plan view. A thickness direction of the vibrating plate 33 is parallel to the Z-axis. The pressure chamber C1 communicates with the communication flow channel 314 and the supply flow channel 312. Accordingly, the pressure chamber C1 communicates with the nozzle N through the communication flow channel 314 and communicates with the space Ra through the supply flow channel 312 and the relay liquid chamber 316.

A piezoelectric element 34 is provided on a surface of the vibrating plate 33 opposite to the pressure chamber C1 for each pressure chamber C1. More specifically, the pressure chamber C1 is provided below the piezoelectric element 34. The piezoelectric element 34 is an elongated passive element along the X-axis in plan view. The piezoelectric element 34 is also a drive element that is driven upon application of a drive signal.

The housing 36 is a case for storing an ink to be supplied to the pressure chambers C1 and is formed, for example, by injection molding of a resin material. The housing 36 has a space Rb and a supply port 361. The supply port 361 is a pipeline through which an ink is supplied from the liquid container 14 and communicates with the space Rb. The space Rb in the housing 36 and the space Ra in the flow channel plate 31 communicate with each other. The space consisting of the space Ra and the space Rb functions as a liquid reservoir R for storing an ink to be supplied to the pressure chambers C1. The ink that is supplied from the liquid container 14 passes through the supply port 361 and is stored in the liquid reservoir R. The ink stored in the liquid reservoir R is branched from the relay liquid chamber 316 into the supply flow channels 312 and supplied to the pressure chambers C1 in parallel, thereby refilling the pressure chambers C1 with the ink. The vibration absorber 42 is a flexible film that functions as a wall surface of the liquid reservoir R and absorbs pressure fluctuations of the ink in the liquid reservoir R.

The sealing member 35 protects the piezoelectric elements 34 and reinforces the mechanical strength of the pressure chamber plate 32 and the vibrating plate 33. The sealing member 35 is fixed to the surface of the vibrating plate 33 with, for example, an adhesive. The sealing member 35 accommodates the piezoelectric elements 34 inside a concave portion of the sealing member 35 on a side that faces the vibrating plate 33. The wiring board 51 is connected to a surface of the vibrating plate 33. The wiring board 51 is a mounting component that has a plurality of wires that electrically connect the control unit 20 and the liquid discharge head 26. The flexible wiring board 51 may be, for example, a flexible printed circuit (FPC) or a flexible flat cable (FFC). A drive signal and a reference voltage for driving the piezoelectric elements 34 are supplied from the wiring board 51 to the individual piezoelectric elements 34.

1-3. Structures of Vibrating Plate and Piezoelectric Element

Figure 4:
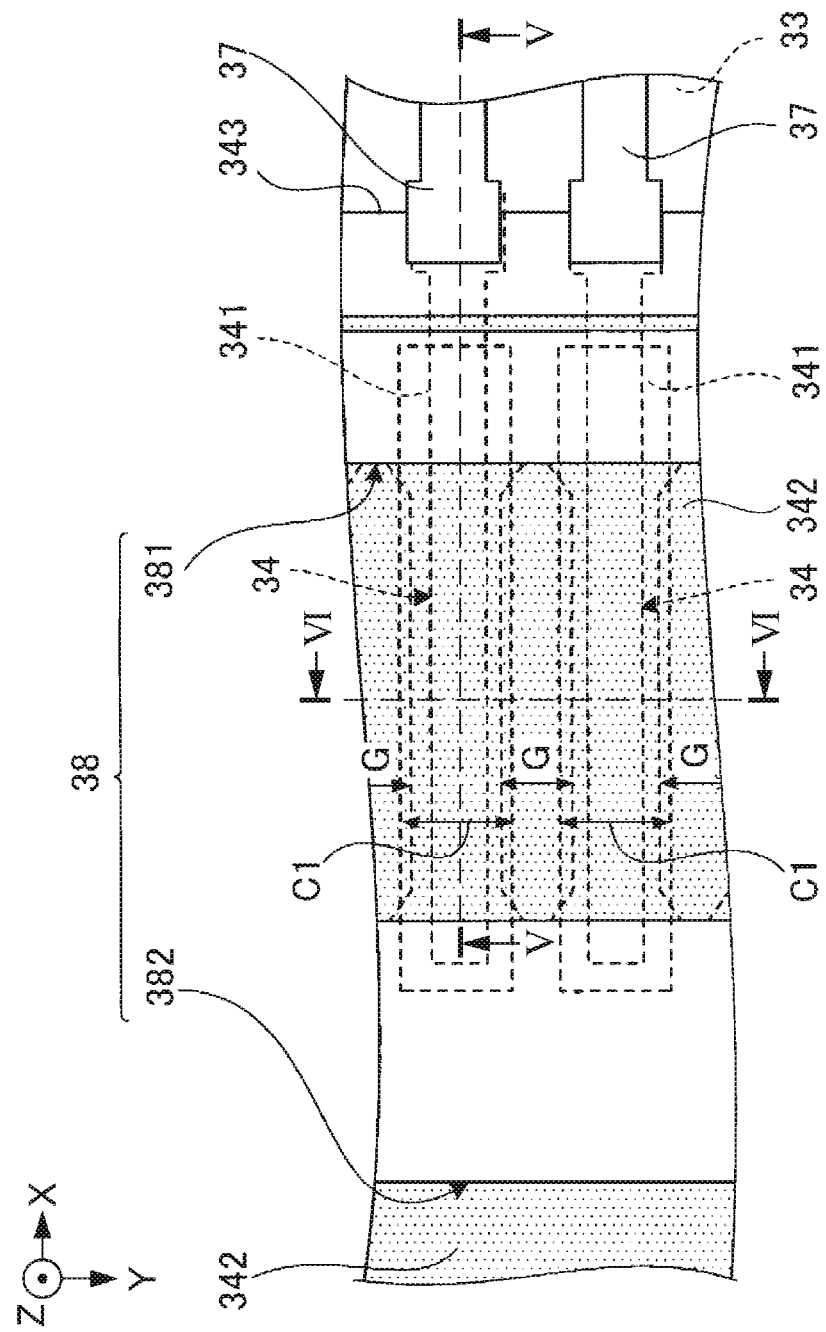
FIG. 4 is a plan view illustrating piezoelectric elements and components around the piezoelectric elements.
Figure 5:
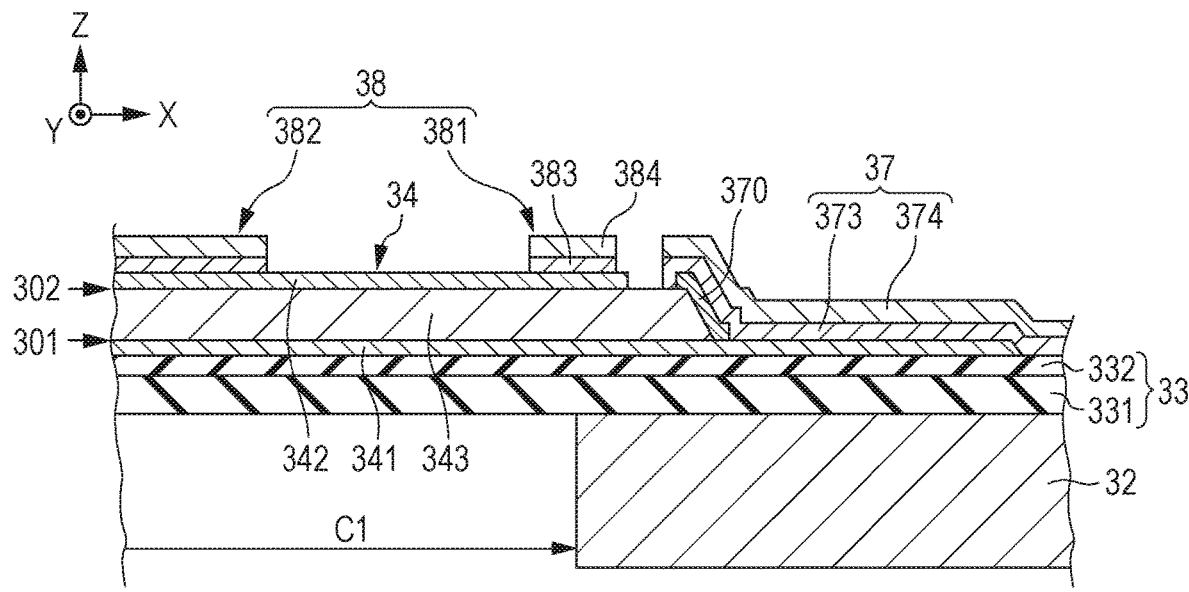
FIG. 5 is a cross-sectional view taken along line V-V in FIG. 4.
Figure 6:
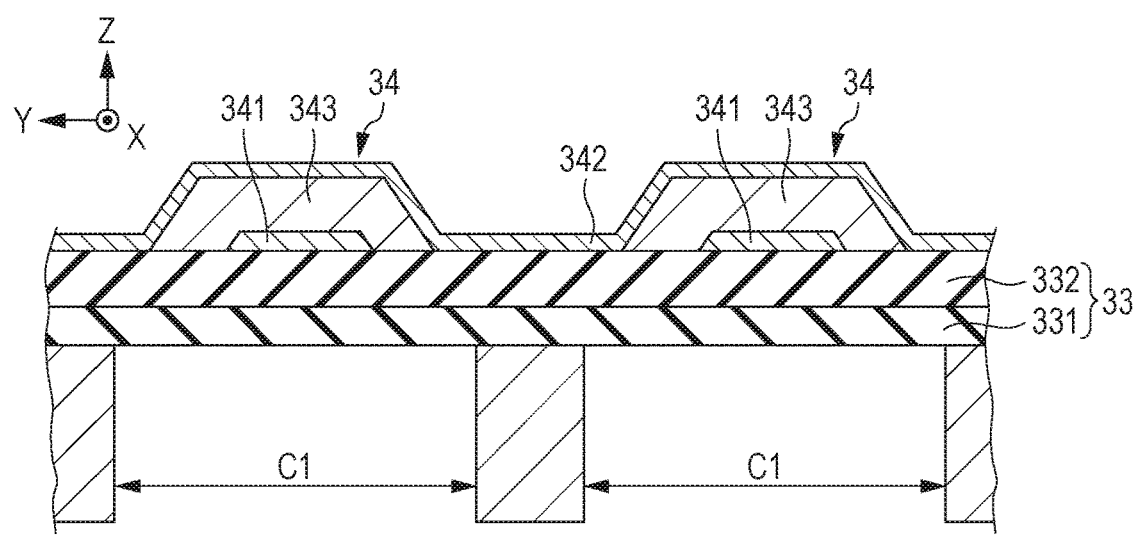
FIG. 6 is a cross-sectional view taken along line VI-VI in FIG. 4.

FIG. 4 is a plan view illustrating the piezoelectric elements 34 and components around the piezoelectric elements 34. In FIG. 4, a second electrode 342, which will be described below, is dotted for convenience. FIG. 5 is a cross-sectional view taken along line V-V in FIG. 4. The cross section illustrated in FIG. 5 is parallel to the X-Z plane. FIG. 6 is a cross-sectional view taken along line VI-VI in FIG. 4. The cross section illustrated in FIG. 6 is parallel to the Y-Z plane.

The vibrating plate 33 vibrates upon driving of the above-described piezoelectric elements 34. As illustrated in FIG. 5 and FIG. 6, the vibrating plate 33 has a first layer 331 and a second layer 332 that are stacked. The first layer 331 is in contact with the pressure chamber plate 32. The second layer 332 is disposed on the first layer 331 opposite to the pressure chamber plate 32. The first layer 331 is an elastic film composed of an elastic material such as silicon dioxide ($SiO_2$). The second layer 332 is an insulating film composed of an insulating material such as zirconium dioxide ($ZrO_2$). Each of the first layer 331 and the second layer 332 is formed by a known deposition technique such as thermal oxidation or sputtering. It should be noted that a part or all of the pressure chamber plate 32 and the vibration plate 33 may be integrally formed by selectively removing areas of a plate-like member having a predetermined thickness corresponding to the pressure chambers C1 in the plate thickness direction.

The piezoelectric element 34 is generally a structure that includes a first electrode 341, a piezoelectric body 343, and the second electrode 342, which are stacked upward in this order from the side of the vibrating plate 33. The first electrode 341 and the second electrode 342 are insulated. The first electrode 341 and the second electrode 342 each have a different potential. The +Z direction and the −Z direction correspond to the stacking directions in which the first electrode 341, the piezoelectric body 343, and the second electrode 342 are stacked. In this specification, the expression "an element B is formed on a surface of an element A" is not limited to denoting a structure in which the element A and the element B are in direct contact. In other words, the concept denoted by "an element B is formed on a surface of an element A" includes a structure in which an element C is formed on a surface of an element A and an element B is formed on a surface of the element C when the element A and the element B partly or completely overlap in plan view.

The first electrode 341 is formed on a surface of the vibrating plate 33. The first electrode 341 is an individual electrode provided for each piezoelectric element 34, and the first electrodes 341 are separated from each other. A drive signal with a varying voltage is applied to the first electrode 341. The first electrode 341 has an elongated shape along the X-axis. The first electrodes 341 are arranged at intervals along the Y-axis. The first electrode 341 may be composed of a conductive material such as platinum (Pt) or iridium (Ir).

As illustrated in FIG. 5, the piezoelectric body 343 is formed on the first electrode 341 and is in contact with the first electrode 341. The piezoelectric body 343 has a first surface 301 that is in contact with the first electrode 341 and a second surface 302 that is opposite to the first surface 301. As illustrated in FIG. 4, the piezoelectric body 343 is a band-shaped dielectric film that extends across a plurality of piezoelectric elements 34 along the Y-axis. The piezoelectric body 343 may be a known piezoelectric material such as lead zirconate titanate (Pb (Zr, Ti) $O_3$). As illustrated in FIG. 4, in the piezoelectric body 343, in a region corresponding to a gap between adjacent pressure chambers C1, a groove G is formed along the X-axis. The groove G is an opening that passes through the piezoelectric body 343. The grooves G enable the individual piezoelectric elements 34 to deform individually for respective pressure chambers C1, resulting in a reduction in propagation of vibration between adjacent piezoelectric elements 34. With this structure, the piezoelectric body 343 has the elongated portions that are defined by the grooves G and extend along the X-axis, and the elongated portions are arranged along the Y-axis. In other words, the direction along the X-axis corresponds to the extending direction, and the direction along the Y-axis corresponds to the arranging direction. It should be noted that each groove G may be a blind hole formed by removing a part of the piezoelectric body 343 in the thickness direction.

As illustrated in FIG. 5 and FIG. 6, the second electrode 342 as a second electrode layer is formed on the piezoelectric body 343 and in contact with the second surface 302 of the piezoelectric body 343. As illustrated in FIG. 4, the second electrode 342 is a band-shaped common electrode that extends across a plurality of piezoelectric elements 34 along the Y-axis. A predetermined reference voltage is applied to the second electrode 342. The reference voltage is a constant voltage and is set to, for example, a voltage higher than a ground voltage. That is, for example, a holding signal with a constant voltage is applied to the second electrode 342. A voltage that corresponds to the difference between the reference voltage applied to the second electrode 342 and the drive signal supplied to the first electrode 341 is applied to the piezoelectric body 343. The drive signal corresponds to an amount of discharge. The holding signal is constant regardless of the discharge amount. It should be noted that the ground voltage may be applied to the second electrode 342. The second electrode 342 may be composed of a low-resistance conductive material such as platinum (Pt) or iridium (Ir).

The piezoelectric body 343 deforms in response to an application of a voltage across the first electrode 341 and the second electrode 342, and the piezoelectric element 34 generates the energy that causes the vibrating plate 33 to bend and deform. The vibrating plate 33 vibrates with the energy generated by the piezoelectric element 34, and this vibration changes the pressure in the pressure chamber C1 to cause the ink in the pressure chamber C1 to be discharged from the nozzle N illustrated in FIG. 3.

As illustrated in FIG. 4 and FIG. 5, a first multilayer wiring 37 is electrically connected to the first electrode 341. The single first multilayer wiring 37 is electrically connected to the single first electrode 341. The first multilayer wiring 37 is a lead to which a drive signal is supplied from a drive circuit (not illustrated) that is mounted on the wiring board 51 illustrated in FIG. 3. The first multilayer wiring 37 applies a drive signal to the first electrode 341. As illustrated in FIG. 4, the first multilayer wiring 37 has an elongated shape extending along the X-axis in plan view. In addition, as illustrated in FIG. 5, a part of the first multilayer wiring 37 is disposed on the piezoelectric body 343 and is in contact with an electrode layer 370, which will be described below.

As illustrated in FIG. 5, the first multilayer wiring 37 includes a first adhesion layer 373 as a first wiring and a first wiring layer 374 as a second wiring. The first adhesion layer 373 is in contact with the first electrode 341 outside the piezoelectric body 343 in the +X direction. The first adhesion layer 373 increases the adhesion of the first multilayer wiring 37 to the first electrode 341. The first adhesion layer 373 is composed of a conductive material that has lower resistance than the first electrode 341. For example, the first adhesion layer 373 is composed of a conductive material such as nichrome (NiCr). The first wiring layer 374 is disposed on the first adhesion layer 373 and covers the first adhesion layer 373. The first wiring layer 374 increases the conductivity of the first multilayer wiring 37. The first wiring layer 374 is composed of a conductive material that has lower resistance than the first electrode 341. For example, the first wiring layer 374 is composed of a conductive material such as gold (Au).

Figure 12:
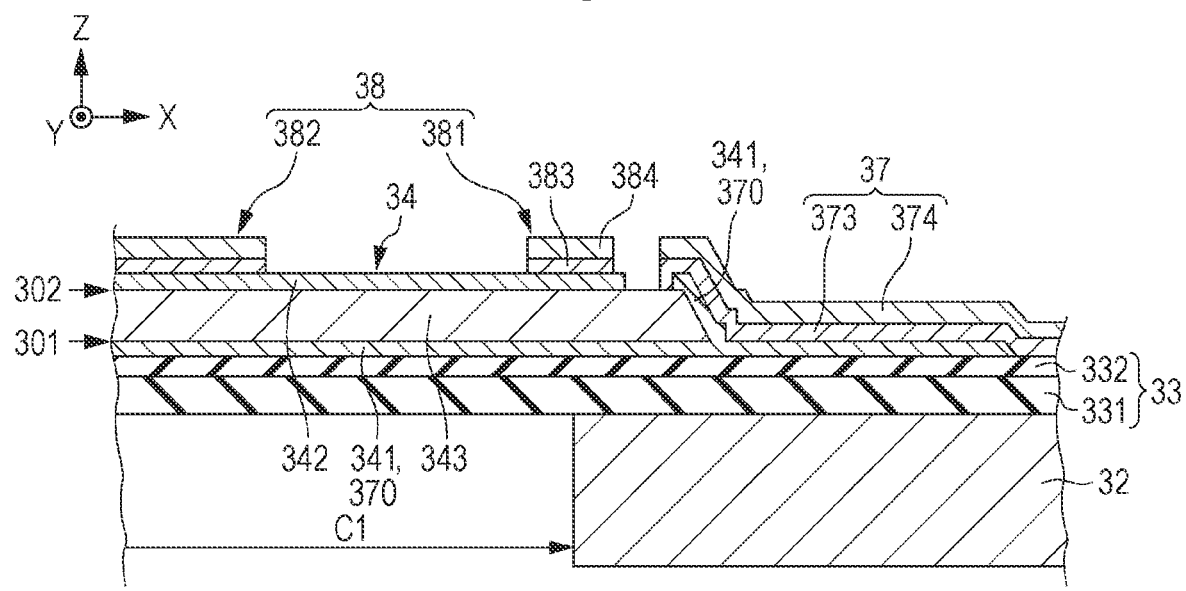
FIG. 12 is an alternate cross-sectional view taken along line V-V in FIG. 4.

The electrode layer 370, which functions as a first electrode layer that is connected to the first electrode 341, is disposed at an end of the piezoelectric body 343 on the +X side. A +X-side end of the electrode layer 370 is connected to the first electrode 341, and a −X-side end is disposed on the piezoelectric body 343 away from the second electrode 342 in the X direction with a space therebetween. The electrode layer 370 may be composed of a conductive material such as platinum (Pt) or iridium (Ir), similarly to the first electrode 341 and the second electrode 342. The first multilayer wiring 37 is formed on both the first electrode 341 and the electrode layer 370. More specifically, the electrode layer 370 and the first multilayer wiring 37 are disposed to cover the +X-side end of the piezoelectric body 343 and extend further to the +X side than the +X-side end of the piezoelectric body 343. The electrode layer 370 is connected to the first electrode 341, and thus when the electrode layer 370 and the first electrode 341 are composed of the same material, the electrode layer 370 and the first electrode 341 can be considered to be the same electrode layer, such as illustrated in FIG. 12. In such a case, both the electrode layer 370 and the first electrode 341 correspond to the first electrode layer, and a part of the first electrode layer R disposed on the top of the piezoelectric body 343 and the other part is disposed on the bottom of the piezoelectric body 343.

As illustrated in FIG. 4 and FIG. 5, a second multilayer wiring 38 that is electrically connected to the second electrode 342 is disposed on a surface of the second electrode 342. A reference voltage is supplied from the control unit 20 illustrated in FIG. 1 to the second multilayer wiring 38 through the wiring board 51 illustrated in FIG. 3. The second multilayer wiring 38 applies the reference voltage to the second electrode 342. As illustrated in FIG. 5, the second multilayer wiring 38 is disposed on the piezoelectric body 343 and in contact with the surface of the second electrode 342 that is opposite to the piezoelectric body 343.

As illustrated in FIG. 4, the second multilayer wiring 38 includes a band-shaped first conductive layer 381 that extends along the Y-axis and a band-shaped second conductive layer 382 that extends along the Y-axis. The first conductive layer 381 and the second conductive layer 382 are aligned along the X-axis with a predetermined space therebetween. The first conductive layer 381 and the second conductive layer 382 suppress a voltage drop in the reference voltage in the second electrode 342. In addition, the first conductive layer 381 and the second conductive layer 382 function as a weight to suppress the vibration of the vibrating plate 33.

As illustrated in FIG. 5, the second multilayer wiring 38 includes a second adhesion layer 383 and a second wiring layer 384. The second adhesion layer 383 is in contact with the second electrode 342. The second adhesion layer 383 increases the adhesion of the second multilayer wiring 38 to the second electrode 342. The second adhesion layer 383 is composed of a conductive material that has lower resistance than the second electrode 342. For example, the second adhesion layer 383 is composed of a conductive material such as nichrome (NiCr). The second wiring layer 384 covers the second adhesion layer 383. The second wiring layer 384 increases the conductivity of the second multilayer wiring 38. The second wiring layer 384 is composed of a conductive material that has lower resistance than the second electrode 342. For example, the second wiring layer 384 is composed of a conductive material such as gold (Au).

The above-described first multilayer wiring 37 and the second multilayer wiring 38 may be composed of different materials or may be composed of the same material. The first multilayer wiring 37 and the second multilayer wiring 38 composed of the same material enable a single forming process of the first multilayer wiring 37 and the second multilayer wiring 38.

Figure 7:
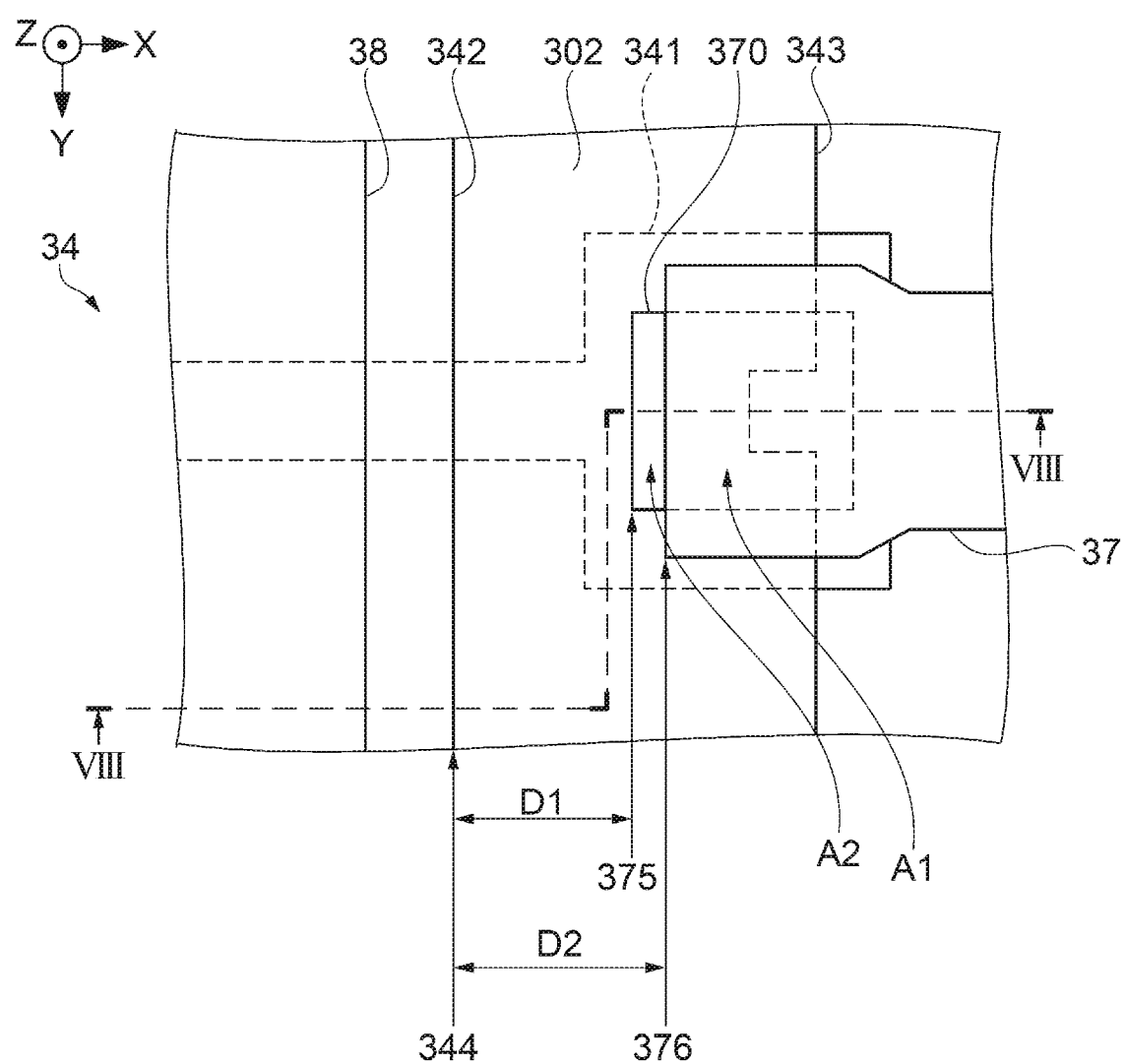
FIG. 7 is an enlarged plan view illustrating a part of a piezoelectric element.
Figure 8:
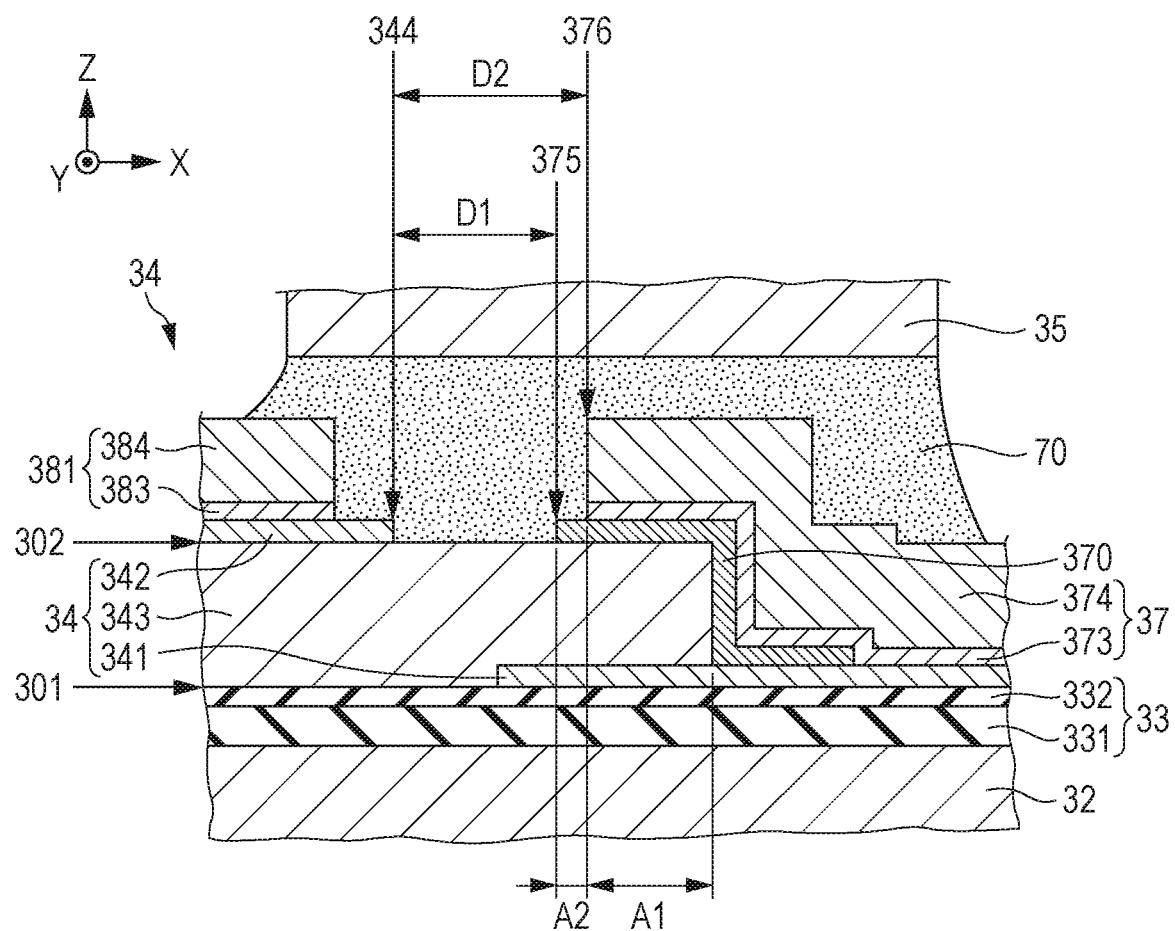
FIG. 8 is an enlarged cross-sectional view illustrating a part of a piezoelectric element.

FIG. 7 is an enlarged plan view illustrating a part of the piezoelectric element 34. FIG. 8 is an enlarged cross-sectional view illustrating a part of the piezoelectric element 34. FIG. 8 is a cross-sectional view taken along line VIII-VIII in FIG. 7. As illustrated in FIG. 7 and FIG. 8, the first multilayer wiring 37 and the second multilayer wiring 38 are disposed on the piezoelectric body 343 with a space therebetween. Between the first multilayer wiring 37 and the second multilayer wiring 38, an insulating adhesive 70 is disposed. The adhesive 70 fixes the sealing member 35 to the surface of the vibrating plate 33. The adhesive 70 is in contact with the first multilayer wiring 37 and the second multilayer wiring 38. Between the first multilayer wiring 37 and the second multilayer wiring 38, the adhesive 70 is in contact with the second surface 302 of the piezoelectric body 343.

The electrode layer 370 and the second electrode 342 are disposed separately on the piezoelectric body 343 with a space therebetween in the X direction. A distance D1 between the electrode layer 370 and the second electrode 342 is shorter than a distance D2 between the first multilayer wiring 37 and the second electrode 342. In other words, the electrode layer 370 extends further on the piezoelectric body 343 in the −X direction than the first multilayer wiring 37. The distance D1 is the shortest distance between an end 375 of the electrode layer 370 on the −X side and an end 344 of the second electrode 342 on the +X side. The distance D2 is the shortest distance between an end 376 of the first multilayer wiring 37 on the −X side and the end 344 of the second electrode 342 on the +X side.

The arrangement in which the electrode layer 370 extends further in the −X direction than the first multilayer wiring 37 enables the electrode layer 370 to be closer to the second electrode 342 than the first multilayer wiring 37. More specifically, the arrangement in which the electrode layer 370 extends further in the −X direction than the first multilayer wiring 37 concentrates the magnetic field strength around the end 375 of the electrode layer 370 on the −X side. Accordingly, the magnetic field strength applied to the end 376 of the first multilayer wiring 37 on the −X side can be suppressed. With this structure, the occurrence of ion migration due to an ionized metal from the first multilayer wiring 37 toward the second electrode 342 can be suppressed or delayed.

In this embodiment, the area A1 in which the electrode layer 370 and the first multilayer wiring 37 overlap each other on the piezoelectric body 343 along the Z-axis corresponds to a first area, and an area A2 adjacent to the area A1 in which the electrode layer 370 extends further in the −X direction than the first multilayer wiring 37 corresponds to a first portion of a second area. As described above, both the electrode layer 370 and the first multilayer wiring 37 are disposed in the area A1, and the first multilayer wiring 37 is not disposed while only the electrode layer 370 is disposed in the area A2. In the first embodiment, the side in the +X direction, that is, the +X side, corresponds to a first side and the side in the −X direction, that is, the −X side, corresponds to a second side.

The first adhesion layer 373 contains a metal that is more likely to cause ion migration than the second electrode 342 and the electrode layer 370. For example, the first adhesion layer 373 contains a metal that has lower ionization energy than the second electrode 342 and the electrode layer 370. More specifically, the first adhesion layer 373 contains nickel or chromium. On the other hand, the second electrode 342 and the electrode layer 370 contain, for example, platinum or iridium as described above. Accordingly, with the above-described structure in which the distance D1 is shorter than the distance D2, the occurrence of ion migration due to an ionized metal moved from the first adhesion layer 373 toward the second electrode 342 can be suppressed.

The first wiring layer 374 may be composed of a metal that is less likely to cause ion migration than the first adhesion layer 373. For example, the first wiring layer 374 contains a metal that has higher ionization energy than the first adhesion layer 373. More specifically, the first wiring layer 374 contains gold (Au) as described above. With this structure in which the first wiring layer 374 is composed of a metal that is less likely to cause ion migration than the first adhesion layer 373, the occurrence of ion migration due to an ionized metal moved from the first wiring layer 374 toward the second electrode 342 can be suppressed.

The electrode layer 370 may be formed using the same material and in the same process as the second electrode 342. By forming the electrode layer 370 and the second electrode 342 in the same process, the distance D1 between the electrode layer 370 and the second electrode 342 can be formed with high accuracy. In addition, since the electrode layer 370 and the second electrode 342 are formed using the same material, the occurrence of ion migration can be suppressed as compared with the electrode layer 370 and the second electrode 342 that are formed using different materials.

As described above, the first multilayer wiring 37 applies a drive signal with varying voltages to the first electrode 341. On the other hand, the second multilayer wiring 38 applies a holding signal with a constant voltage to the second electrode 342. To the first electrode 341, a voltage higher than the holding signal is steeply applied. Accordingly, the metal of the first multilayer wiring 37 is more likely to be ionized than the second multilayer wiring 38. With the above-described structure in which the distance D1 is shorter than the distance D2, the occurrence of ion migration due to an ionized metal moved from the first multilayer wiring 37 can be suppressed.

As illustrated in FIG. 8, on the piezoelectric body 343, a part of the first multilayer wiring 37 and the second electrode 342 are disposed. The first multilayer wiring 37 is insulated from the second multilayer wiring 38 and the second electrode 342. In the structure in which a part of the first multilayer wiring 37 and the second electrode 342 are disposed on the piezoelectric body 343, the distance D1 that is shorter than the distance D2 can suppress the occurrence of ion migration between the second electrode 342 and the first multilayer wiring 37.

In the above-described liquid discharge apparatus 100 that includes the liquid discharge head 26, the arrangement of the first adhesion layer 373, which is more likely to cause ion migration than the second electrode 342 and the electrode layer 370 composed of platinum or iridium and contains a metal having low ionization energy such as nickel or chromium, is limited as compared to the electrode layer 370. With this structure, accordingly, ion migration of the first adhesion layer 373 can be suppressed. In addition, on the first adhesion layer 373, the first wiring layer 374 that is composed of a metal that is less likely to cause ion migration than the first adhesion layer 373 and has higher ionization energy than the first adhesion layer 373 such as gold (Au) is disposed. The arrangement of the first wiring layer 374 is also limited as compared with the electrode layer 370, and thus ion migration from the first wiring layer 374 can be suppressed.

2. Second Embodiment

Figure 9:
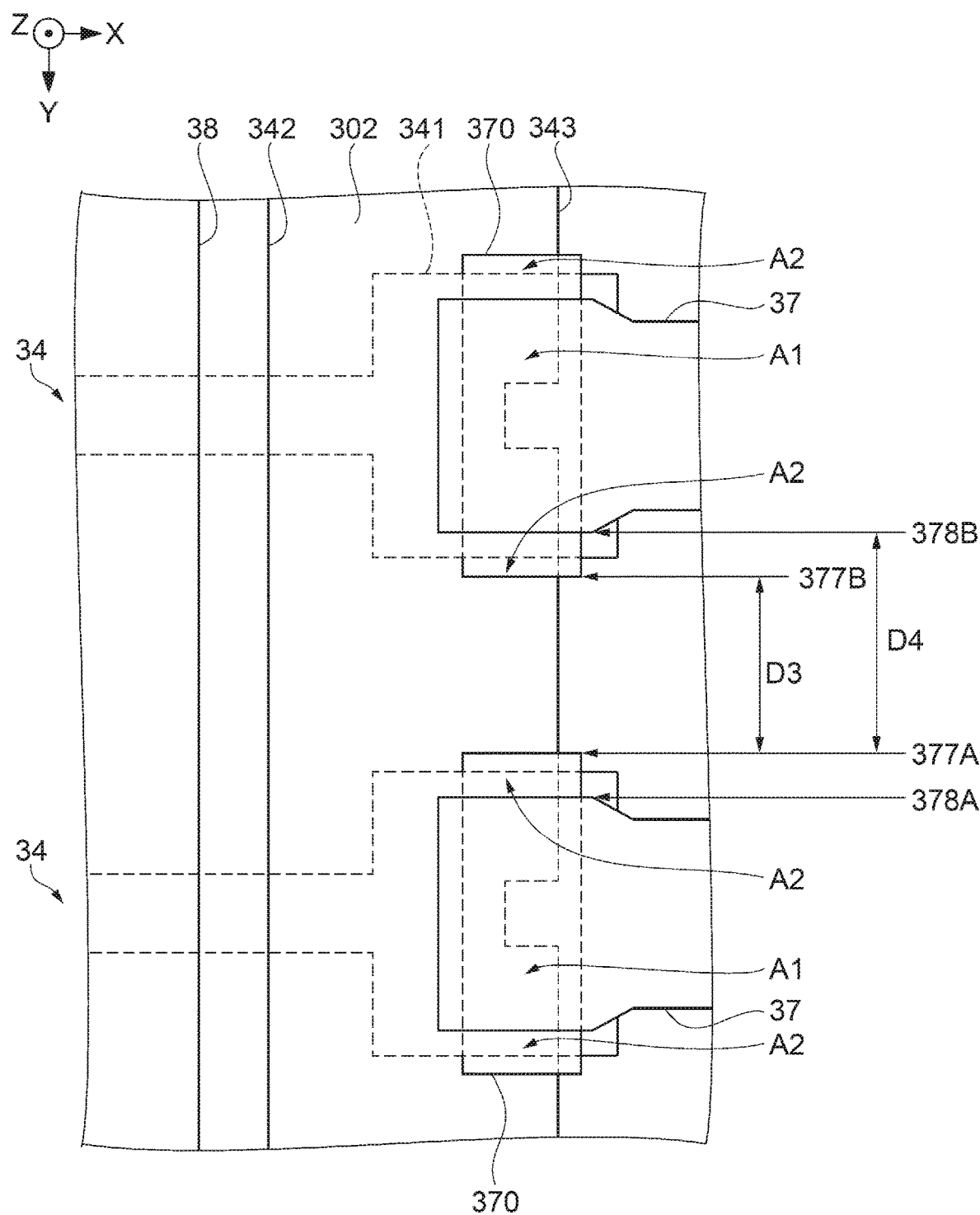
FIG. 9 is an enlarged plan view illustrating a part of a piezoelectric element according to a second embodiment.

Next, a second embodiment will be described. To components similar to those in the first embodiment, same reference numerals are given to omit their overlapping descriptions. FIG. 9 is an enlarged plan view illustrating a part of a piezoelectric element 34 according to the second embodiment, and illustrating a part of two adjacent piezoelectric elements 34. As illustrated in FIG. 9, electrode layers 370 that are adjacent along the Y-axis are disposed on the piezoelectric body 343 with a space therebetween. Similarly, first multilayer wirings 37 that are adjacent along the Y-axis are disposed on the piezoelectric body 343 with a space therebetween. A distance D3 between the adjacent electrode layers 370 is shorter than a distance D4 between the electrode layer 370 of one piezoelectric element 34 and the first multilayer wiring 37 of the other adjacent piezoelectric element 34. In other words, the electrode layer 370 extends further in the +Y direction and the −Y direction than the first multilayer wiring 37. The distance D3 is the shortest distance between an end 377A and an end 377B, which face each other, of the adjacent electrode layers 370. The distance D4 is the shortest distance between the end 377A of the electrode layer 370 of one piezoelectric element 34 and an end 378B of the first multilayer wiring 37 of the other piezoelectric element 34 that faces the end 377A.

The arrangement in which the electrode layer 370 extends further in the +Y direction and the −Y direction than the first multilayer wiring 37 enables the end 377B of the electrode layer 370 of the one piezoelectric element 34 to be closer to the end 377A of the electrode layer 370 of the other piezoelectric element 34 than the end 378B of the first multilayer wiring 37 of the piezoelectric element 34. More specifically, the arrangement in which the electrode layer 370 extends further in the +Y direction and the −Y direction than the first multilayer wiring 37 concentrates the magnetic field strength around the end 377A of the one electrode layer 370 and the end 377B of the other electrode layer 370. Accordingly, the magnetic field strength applied to an end 378A of the one first multilayer wiring 37 and the end 378B of the other first multilayer wiring 37 can be suppressed. With this structure, the occurrence of ion migration due to an ionized metal moved from the first multilayer wiring 37 toward the adjacent first multilayer wiring 37 can be suppressed or delayed.

Drive signals applied to the first multilayer wirings 37 vary depending on amounts of discharge of ink. This variation causes voltage differences between the adjacent first multilayer wirings 37 and between the adjacent electrode layers 370. Large variations between the adjacent first multilayer wirings 37 and between the adjacent electrode layers 370 can cause ion migration. However, with the above-described structure in which the distance D3 is shorter than the distance D4, the occurrence of ion migration due to an ionized metal moved from the first multilayer wiring 37 toward the adjacent first multilayer wiring 37 can be suppressed.

In this embodiment, an area A1 in which the electrode layer 370 and the first multilayer wiring 37 overlap each other on the piezoelectric body 343 along the Z-axis corresponds to a first area, and an area A2 adjacent to the area A1 in which the electrode layer 370 extends further in the +Y direction and the −Y direction than the first multilayer wiring 37 corresponds to a second portion of a second area. In this structure, both the electrode layer 370 and the first multilayer wiring 37 are disposed in the area A1, and the first multilayer wiring 37 is not disposed while only the electrode layer 370 is disposed in the area A2.

3. Third Embodiment

Next, a third embodiment will be described. To components similar to those in the first embodiment, same reference numerals are given to omit their overlapping descriptions.

Figure 10:
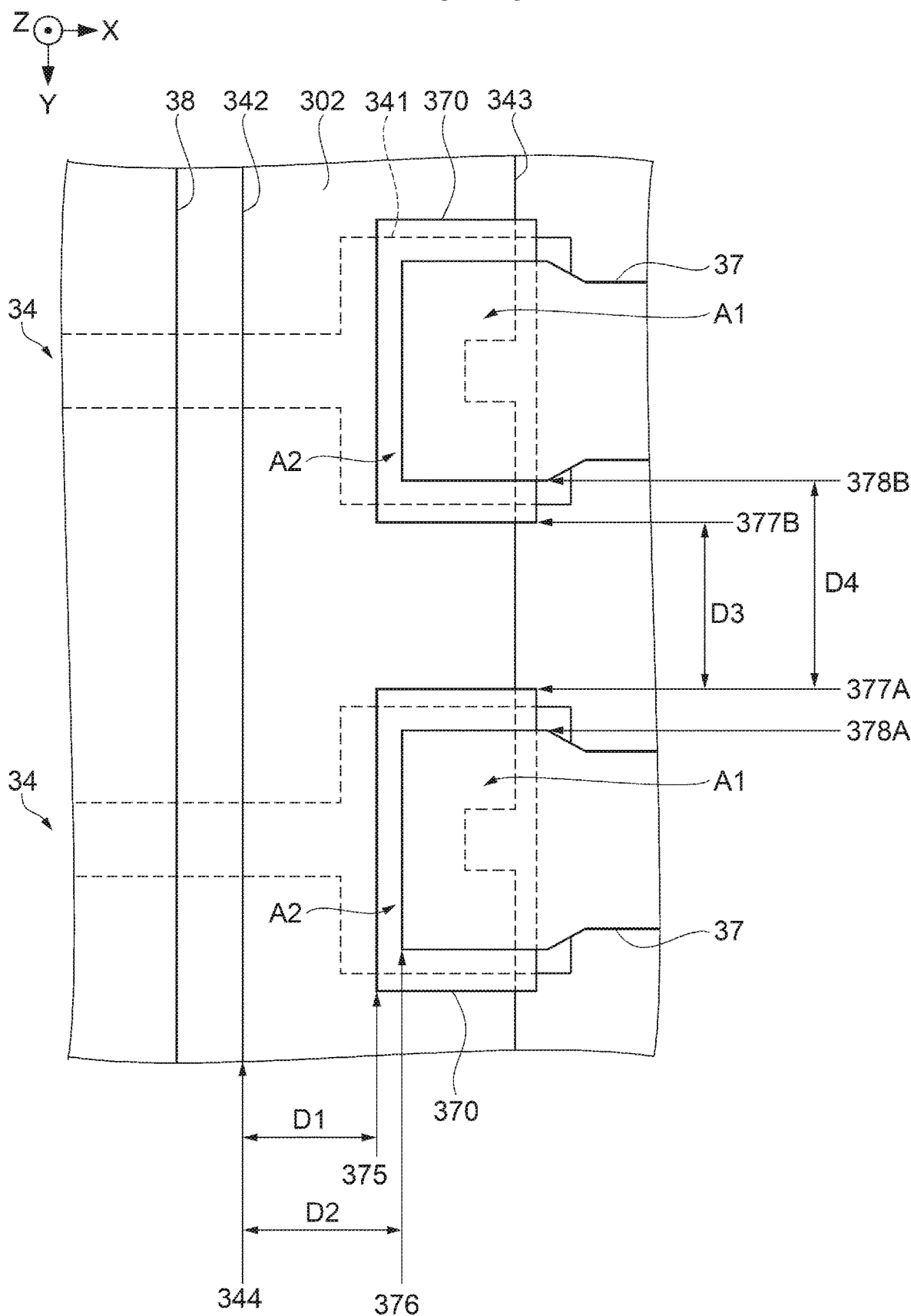
FIG. 10 is an enlarged plan view illustrating a part of a piezoelectric element according to a third embodiment.

FIG. 10 is an enlarged plan view illustrating a part of a piezoelectric element 34 according to the third embodiment, and illustrating two adjacent piezoelectric elements 34. As illustrated in FIG. 10, a distance D1 between the electrode layer 370 and the second electrode 342 is shorter than a distance D2 between the first multilayer wiring 37 and the second electrode 342. In other words, the electrode layer 370 extends further in the −X direction than the first multilayer wiring 37. A distance D3 between the electrode layers 370 that are adjacent to each other along the Y-axis is shorter than a distance D4 between the electrode layer 370 of one piezoelectric element 34 and the first multilayer wiring 37 of the other piezoelectric element 34. In other words, the electrode layer 370 extends further in the +Y direction and the −Y direction than the first multilayer wiring 37. The arrangement in which the electrode layer 370 that extends further in the −X direction than the first multilayer wiring 37 enables the electrode layer 370 to be closer to the second electrode 342 than the first multilayer wiring 37. More specifically, the arrangement in which the electrode layer 370 that extends further in the −X direction than the first multilayer wiring 37 concentrates the magnetic field strength around the end 375 of the electrode layer 370 on the −X side. Accordingly, the magnetic field strength applied to the end 376 of the first multilayer wiring 37 on the −X side can be reduced. With this structure, the occurrence of ion migration due to an ionized metal from the first multilayer wiring 37 toward the second electrode 342 can be suppressed or delayed. The arrangement in which the electrode layer 370 extends further in the +Y direction and the −Y direction than the first multilayer wiring 37 enables the end 377B of the electrode layer 370 of the one piezoelectric element 34 to be closer to the end 377A of the electrode layer 370 of the other piezoelectric element 34 than the end 378B of the first multilayer wiring 37 of the piezoelectric element 34. More specifically, the arrangement in which the electrode layer 370 extends further in the +Y direction and the −Y direction than the first multilayer wiring 37 concentrates the magnetic field strength around the end 377A of the one electrode layer 370 and the end 377B of the other electrode layer 370. Accordingly, the magnetic field strength applied to the end 378A of the one first multilayer wiring 37 and the end 378B of the other first multilayer wiring 37 can be suppressed. With this structure, the occurrence of ion migration due to an ionized metal moved from the first multilayer wiring 37 toward the adjacent first multilayer wiring 37 can be suppressed or delayed.

In this embodiment, an area A1 in which the electrode layer 370 and the first multilayer wiring 37 overlap each other on the piezoelectric body 343 along the Z-axis corresponds to a first area, and an area A2 adjacent to the area A1 in which the electrode layer 370 extends further in the -X direction, +Y direction, and the -Y direction than the first multilayer wiring 37 corresponds to a second area. The area that extends in the -X direction corresponds to a first portion, and an area that extends in the +Y direction and the -Y direction correspond to a second portion. As described above, both the electrode layer 370 and the first multilayer wiring 37 are disposed in the area A1, and the first multilayer wiring 37 is not disposed while only the electrode layer 370 is disposed in the area A2.

4. Fourth Embodiment

Figure 11:
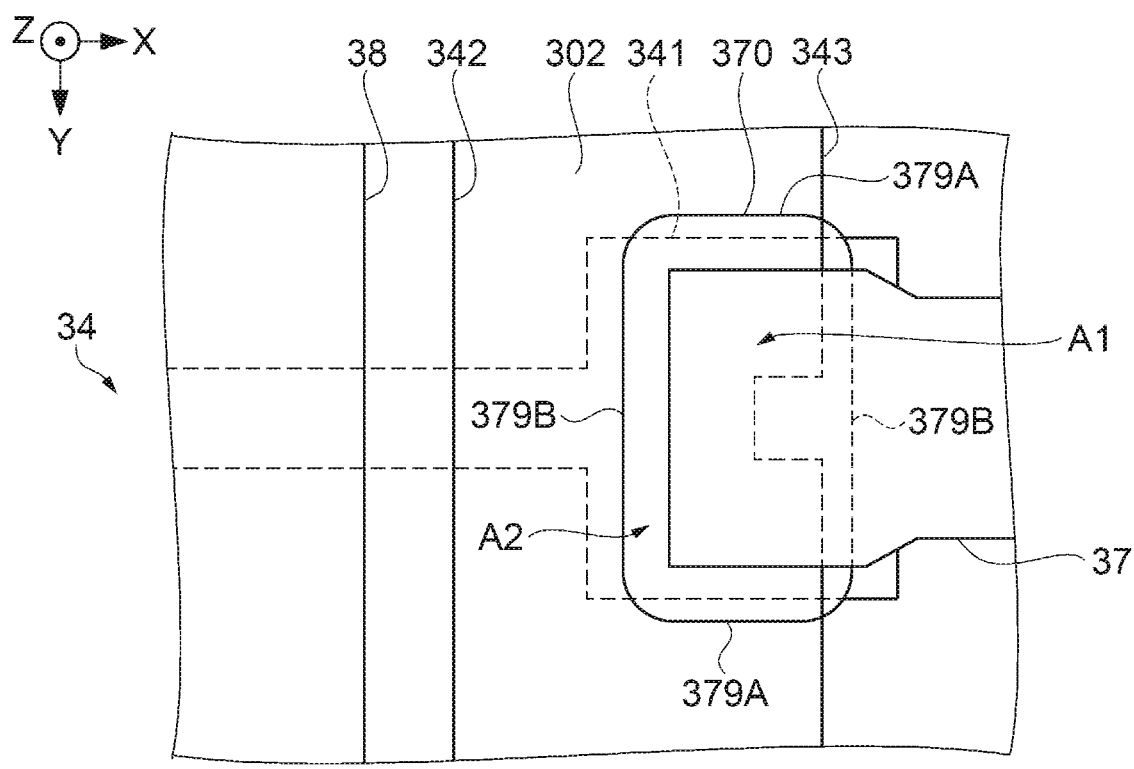
FIG. 11 is an enlarged plan view illustrating a part of a piezoelectric element according to a fourth embodiment.

Next, a fourth embodiment will be described. To components similar to those in the first embodiment, same reference numerals are given to omit their overlapping descriptions. FIG. 11 is an enlarged plan view illustrating a part of a piezoelectric element 34 according to a fourth embodiment. As illustrated in FIG. 11, an area A2 of the electrode layer 370 in plan view is surrounded by sides 379A that are parallel to the X-axis at boundaries of portions extending from an area A1 in the +Y direction and the -Y direction, and sides 379B that are parallel to the Y-axis at boundaries of portions extending from the area A1 in the +X direction and the -X direction. The sides 379A and the sides 379B are adjoined each other in a curved shape. The electrode layer 370 that has the curved corners can reduce the electric field strength at the corners where the electric field is likely to be locally concentrated. With this structure, the occurrence of ion migration can be suppressed or delayed.

Each embodiment can be modified as described below.

In the embodiments, the whole second multilayer wiring 38 is disposed on the piezoelectric body 343; however, at least a part of the second multilayer wiring 38 may be disposed on the piezoelectric body 343. In the embodiments, a part of the first multilayer wiring 37 is disposed on the piezoelectric body 343; however, the whole first multilayer wiring 37 may be disposed on the piezoelectric body 343.

In the embodiments, the outer shape of the first wiring layer 374 may be smaller than that of the first adhesion layer 373 with the first wiring layer 374 disposed on the first adhesion layer 373. In other words, in plan view, the first wiring layer 374 may be disposed inside the first adhesion layer 373. In such a case, since the first wiring layer 374 is smaller than the first adhesion layer 373, the first adhesion layer 373 always exists between the first wiring layer 374 and the electrode layer 370. The first adhesion layer 373 between the first wiring layer 374 and the electrode layer 370 leaves less etching residue between the first wiring layer 374 and the electrode layer 370 than a structure with no first adhesion layer 373, and thus the occurrence of ion migration can be suppressed.

In the embodiments, the vibrating plate 33 includes the first layer 331 and the second layer 332; however, the vibrating plate 33 may not include, for example, the second layer 332.

In the embodiments, individual electrodes are the first electrodes 341 of the piezoelectric elements 34 and the common electrode is the second electrode 342; however, the individual electrodes may be the second electrodes 342 and the common electrode may be the first electrode 341. Alternatively, both the first electrodes 341 and the second electrodes 342 may be individual electrodes. In the embodiments, the first electrode 341 is disposed on the bottom of the piezoelectric body 343 and the second electrode 342 is disposed on the top of the piezoelectric body 343; however, the second electrode 342 may be disposed on the bottom of the piezoelectric body 343 and the first electrode 341 may be disposed on the top of the piezoelectric body 343.

In the embodiments, the piezoelectric element 34 includes the stacked first electrode 341, piezoelectric body 343, and second electrode 342. Between the first electrode 341 and the piezoelectric body 343, another component may be disposed as long as the function of the piezoelectric element 34 is not impaired. Similarly, between the second electrode 342 and the piezoelectric body 343, another component may be disposed.

In the embodiments, the example serial-type liquid discharge apparatus 100 has been described that reciprocates the transport member 242 with the liquid discharge head 26 mounted thereon. Embodiments of the present disclosure may use a line-type liquid discharge apparatus that includes a plurality of nozzles N that cover the entire width of a medium 12.

The liquid discharge apparatus 100 according to the embodiments may be employed in devices dedicated for printing, and various devices such as facsimile apparatuses and copying machines. It should be noted that the usage of the liquid discharge apparatus according to the embodiments of the present disclosure is not limited to printing. For example, a liquid discharge apparatus that discharges solutions of coloring materials can be used as a manufacturing apparatus for producing color filters for display apparatuses such as liquid crystal display panels. Furthermore, a liquid discharge apparatus that discharges a solution of a conductive material can be used as a manufacturing apparatus for producing wires and electrodes of wiring boards. A liquid discharge apparatus that discharges a solution of an organic substance related to a living body can be used, for example, as a manufacturing apparatus for manufacturing biochips.

The example piezoelectric element 34 in the embodiments can be used in devices such as ultrasonic oscillators, ultrasonic motors, piezoelectric transformers, piezoelectric speakers, piezoelectric pumps, and pressure electric converters.

What is claimed is:
1. A liquid discharge head to discharge a liquid comprising:
a piezoelectric body;
a first electrode layer disposed at least partly on the piezoelectric body in a stacking direction; and
a first wiring disposed on the first electrode layer in the stacking direction, the first wiring being more likely to cause ion migration than the first electrode layer,
wherein the piezoelectric body, the first electrode layer, and the first wiring are stacked in this order in the stacking direction, wherein when a predetermined area on the piezoelectric body is a first area, and a predetermined area adjacent to the first area on the piezoelectric body is a second area,
both the first wiring and the first electrode layer are disposed in the first area, and
the first wiring is not disposed while the first electrode layer is disposed in the second area, and
wherein a plurality of the piezoelectric bodies are disposed in an arranging direction, and the second area of the piezoelectric body includes a second portion adjacent in the arranging direction with respect to the first area.

2. The liquid discharge head according to claim 1, further comprising:
a second wiring disposed on the first wiring in the stacking direction, the second wiring being less likely to cause ion migration than the first wiring.

3. The liquid discharge head according to claim 1, further comprising:
a second wiring disposed on the first wiring in the stacking direction, the second wiring having higher ionization energy than the first wiring.

4. The liquid discharge head according to claim 1, further comprising:
a second wiring disposed on the first wiring in the stacking direction, the second wiring containing gold (Au).

5. The liquid discharge head according to claim 2, wherein the second wiring is disposed in the first area, and the second wiring is not disposed in the second area.

6. The liquid discharge head according to claim 1, wherein
each of the piezoelectric bodies extends in an extending direction intersecting the arranging direction.

7. The liquid discharge head according to claim 6, further comprising:
a second electrode layer disposed at least partly on the piezoelectric body in the stacking direction, the second electrode layer being disposed away from the first electrode layer in the extending direction.

8. The liquid discharge head according to claim 7, wherein the first electrode layer and the second electrode layer are composed of an identical material.

9. The liquid discharge head according to claim 8, wherein to the first electrode layer, a drive signal with varying voltages is applied, and to the second electrode layer, a holding signal with a constant voltage is applied.

10. The liquid discharge head according to claim 6, wherein the first electrode layer and the first wiring are disposed to cover an end of the piezoelectric body on a first side in the extending direction.

11. The liquid discharge head according to claim 10, wherein the first electrode layer and the second electrode layer extend toward the first side further than the end of the piezoelectric body on the first side.

12. The liquid discharge head according to claim 6, wherein the second area includes a first portion adjacent to a second side in the extending direction with respect to the first area.

13. The liquid discharge head according to claim 6, wherein the second area includes a first portion adjacent to a second side in the extending direction with respect to the first area, and
a second portion adjacent in the arranging direction with respect to the first area.

14. The liquid discharge head according to claim 13, wherein the first portion and the second portion are adjoined each other in a curved shape when viewed in the stacking direction.

15. The liquid discharge head according to claim 1, wherein a part of the first electrode layer is disposed on a top of the piezoelectric body and another part is disposed on a bottom of the piezoelectric body.

16. The liquid discharge head according to claim 1, further comprising:
a pressure chamber provided below the piezoelectric body in the stacking direction, the pressure chamber into which a liquid to be discharged in response to driving of the piezoelectric body is to be supplied.

17. A liquid discharge apparatus comprising the liquid discharge head according to claim 1.

18. The liquid discharge head according to claim 1, wherein
when a predetermined area adjacent to the second area on the piezoelectric body is a third area,
both the first wiring and the first electrode layer are not disposed in the third area,
the first area, the second area and the third area, are disposed in this order in the arranging direction.

* * * * *